(12) United States Patent
Ke et al.

(10) Patent No.: US 11,610,611 B2
(45) Date of Patent: Mar. 21, 2023

(54) DYNAMIC RANDOM ACCESS MEMORY AND METHOD FOR MANUFACTURING THE DRAM HAVING A BOTTOM SURFACE OF A BIT LINE CONTACT STRUCTURE HIGHER THAN A TOP SURFACE OF A DIELECTRIC LAYER FORMED ON A BURIED WORD LINE

(71) Applicant: Winbond Electronics Corp., Taichung (TW)

(72) Inventors: Ting-Ting Ke, Changhua County (TW); Chien-Hsu Tseng, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 98 days.

(21) Appl. No.: 17/313,462

(22) Filed: May 6, 2021

(65) Prior Publication Data
US 2021/0350834 A1 Nov. 11, 2021

(30) Foreign Application Priority Data
May 8, 2020 (TW) .................. 109115344

(51) Int. Cl.
*H01L 27/108* (2006.01)
*G11C 5/06* (2006.01)

(52) U.S. Cl.
CPC ........ *G11C 5/063* (2013.01); *H01L 27/10823* (2013.01); *H01L 27/10876* (2013.01); *H01L 27/10885* (2013.01); *H01L 27/10888* (2013.01); *H01L 27/10891* (2013.01)

(58) Field of Classification Search
CPC ......... H01L 27/10823; H01L 27/10876; H01L 27/10885; H01L 27/10888; H01L 27/10891; G11C 5/063
USPC ....................................... 257/330
See application file for complete search history.

(56) References Cited

U.S. PATENT DOCUMENTS

| | | |
|---|---|---|
| 2003/0022486 A1 | 1/2003 | Wu |
| 2012/0086063 A1 | 4/2012 | Taniguchi |
| 2015/0126013 A1 | 5/2015 | Hwang et al. |
| 2016/0240538 A1* | 8/2016 | Oh .................... H01L 21/28079 |
| 2019/0019542 A1 | 1/2019 | Chang et al. |

* cited by examiner

*Primary Examiner* — Hoai V Pham
(74) *Attorney, Agent, or Firm* — Muncy, Geissler, Olds & Lowe, P.C.

(57) ABSTRACT

A DRAM and its manufacturing method are provided. The DRAM includes a buried word line, a first dielectric layer, a bit line, and a bit line contact structure. The buried word line is formed in a word line trench of the substrate, and extends along a first direction. The first dielectric layer is formed in the word line trench, located on the buried word line, and has a top surface lower than the top surface of the substrate. The bit line contact structure is formed on the substrate, and has a bottom surface higher than the top surface of the first dielectric layer. The bit line is formed on the substrate and extends along a second direction perpendicular to the first direction.

12 Claims, 10 Drawing Sheets

DYNAMIC RANDOM ACCESS MEMORY AND METHOD FOR MANUFACTURING THE DRAM HAVING A BOTTOM SURFACE OF A BIT LINE CONTACT STRUCTURE HIGHER THAN A TOP SURFACE OF A DIELECTRIC LAYER FORMED ON A BURIED WORD LINE

CROSS REFERENCE TO RELATED APPLICATIONS

This Application claims priority of Taiwan Patent Application No. 109115344, filed on May 8, 2020, the entirety of which is incorporated by reference herein.

BACKGROUND OF THE INVENTION

Field of the Invention

The present disclosure relates to a memory device, and in particular it relates to a dynamic random access memory and a method for manufacturing the dynamic random access memory.

Description of the Related Art

With the trend of miniaturization of electronic products, there is also a demand for miniaturization of memory devices. However, with the miniaturization of memory devices, it has become more difficult to improve the yield of such memory devices.

For example, in a dynamic random access memory (DRAM) having buried word lines, a bit line contact structure which is electrically connected to the bit line is usually formed between adjacent buried word lines. In the lithography process for forming the bit line contact holes, if the size of the bit line contact hole is too small, the exposure result for forming the bit line contact hole may not be done ideally. Therefore, the bit line contact structure cannot be formed or causes fail of DRAM. As a result, the yield of the memory device will be reduced. On the other hand, if the size of the bit line contact hole is too large, adjacent bit line contact holes may come into contact with each other and short-circuit. As a result, the yield of the memory device will also be reduced. Furthermore, the locations where the above-mentioned bit line contact structures will cause fail or short-circuit cannot be expected. Therefore, when the critical dimensions are very small, it becomes very difficult to control the conventional lithography process for forming the bit line contact holes, and the process complexity and cost of the lithography process are very high. With the miniaturization of memory devices, the above problems will become more serious.

Therefore, in this technical field, there is still a need for a DRAM with a high yield and a method of forming such a DRAM.

BRIEF SUMMARY OF THE INVENTION

The disclosure provides a DRAM and a method for manufacturing the same. The manufacturing method of the DRAM can reduce the complexity of the manufacturing process and the production cost, and improve the yield of the memory device.

In accordance with some embodiments of the present disclosure, a DRAM is provided. The DRAM includes a buried word line, a first dielectric layer, a bit line, and a bit line contact structure. The buried word line is formed in a word line trench of a substrate and extends along a first direction. The first dielectric layer is formed in the word line trench, located on the buried word line, and has a top surface lower than the top surface of the substrate. The bit line contact structure is formed on the substrate, and has a bottom surface higher than the top surface of the first dielectric layer. The bit line is formed on the substrate, and extends along a second direction that is perpendicular to the first direction.

In accordance with some embodiments of the present disclosure, a method for manufacturing a DRAM is provided. The method includes forming a buried word line in a word line trench of a substrate, and extending along a first direction. The method includes forming a first dielectric layer in the word line trench, in which the first dielectric layer is located on the buried word line and has a top surface lower than the top surface of the substrate. The method includes forming a bit line on the substrate, and extending along a second direction that is perpendicular to the first direction. The method includes forming a bit line contact structure on the substrate, and located between the bit line and the substrate. A bottom surface of the bit line contact structure is higher than the top surface of the first dielectric layer.

In the method for manufacturing a DRAM provided by the embodiments of the present invention, a plurality of parallel bit line contact trenches are formed first, and then a bit line contact structure is formed at the intersection of the bit line contact trench and the bit line in a self-aligned manner. Compared with forming a bit line contact hole in a hole shape, the method provided by the present invention can reduce the use of a photomask, and can prevent the occurrence of the position deviation and the size variation of the bit line contact holes during the exposure step. Furthermore, the DRAM provided by the present invention can precisely control the position and size of the bit line contact structure. Therefore, the yield of the memory device can be improved.

BRIEF DESCRIPTION OF THE DRAWINGS

FIG. 2A, FIG. 2B, FIG. 3A, FIG. 3B, FIG. 4A.

DETAILED DESCRIPTION OF THE INVENTION

The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately".

Figure 1:
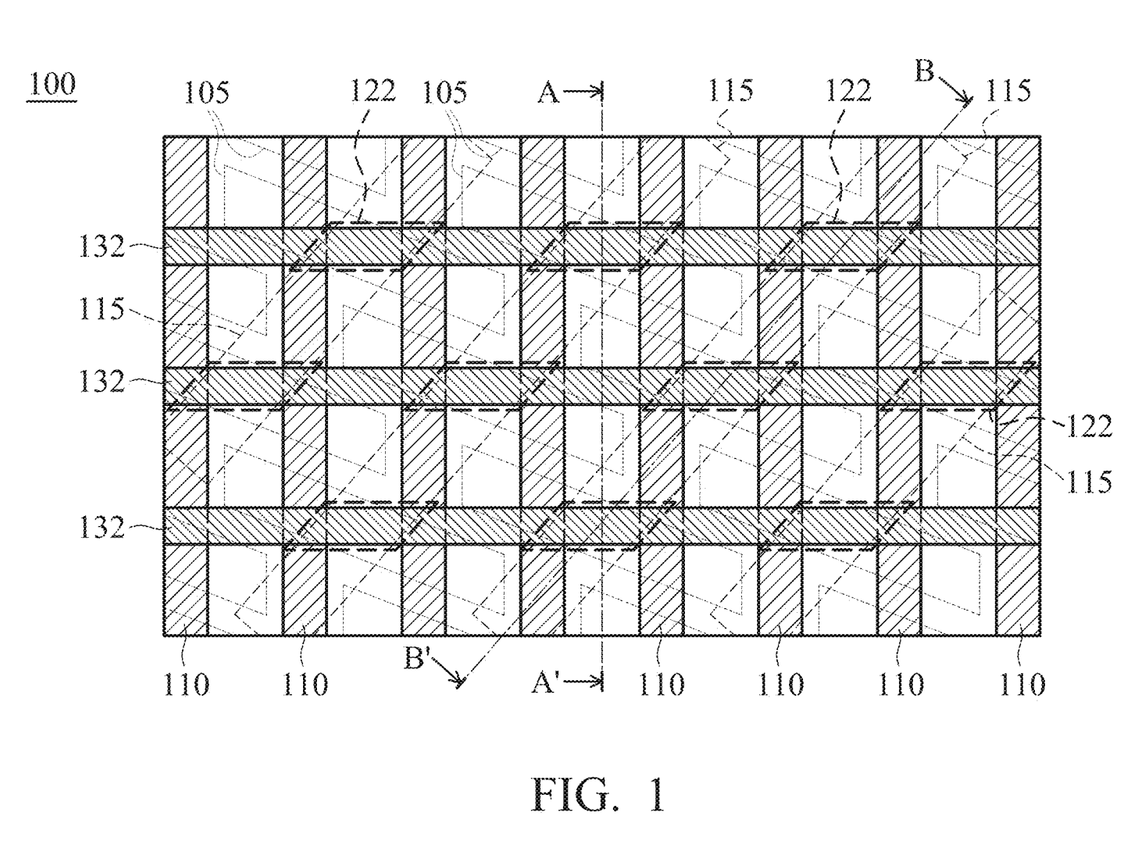
FIG. 1 is a perspective top-view of the DRAM in accordance with some embodiments of the present invention.

FIG. 1 is a perspective top-view of the DRAM 100 in accordance with some embodiments of the present invention. FIGS. 2A, 3A, 4A, 5A, 6A, 7A, 8A, 9A, and 10A are cross-sectional views taken along line AA' of FIG. 1. FIGS. 2B, 3B, 4B, 5B, 6B, 7B, 8B, 9B, and 10B are cross-sectional views taken along line BB' of FIG. 1.

Figure 2A:
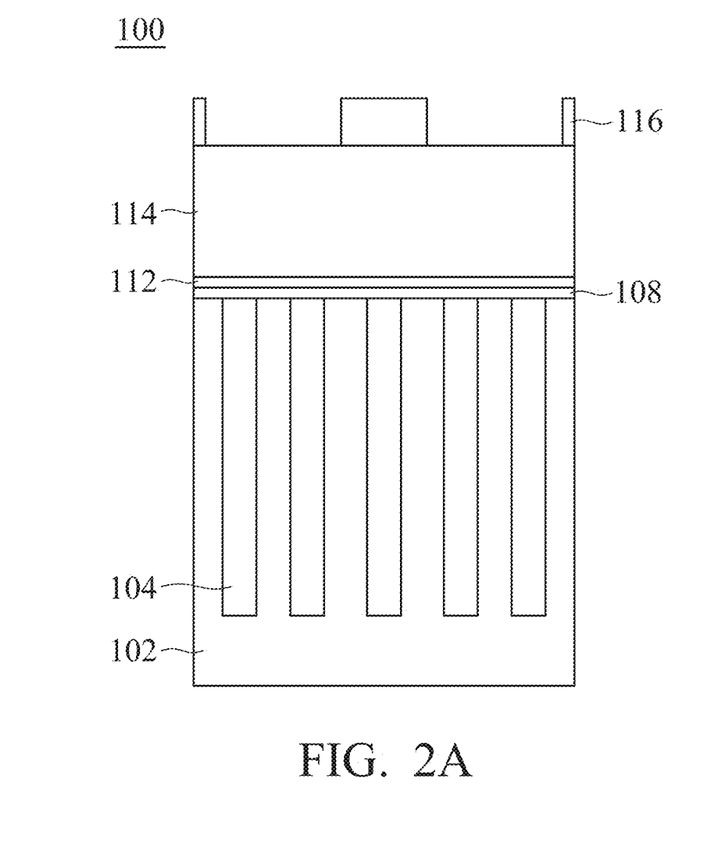
Figure 2B:
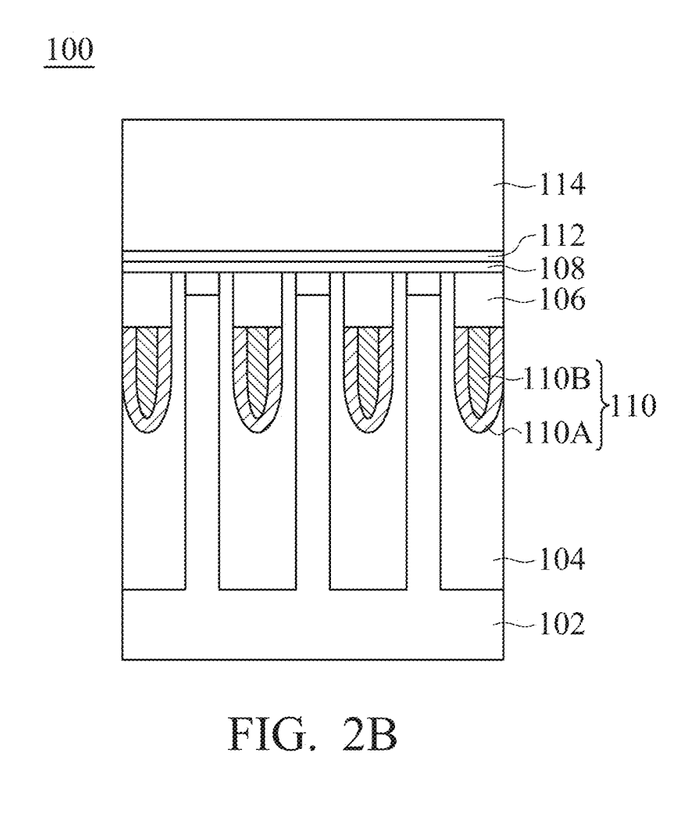

Referring to FIG. 1, FIG. 2A and FIG. 2B, isolation structures 104 are formed in the substrate 102. In the present embodiment, the substrate 102 is a silicon substrate. Other structures may be formed in the substrate 102. For example, a p-type well region, an n-type well region, or a conductive region (not shown) can be formed in the substrate 102 by an implantation process. The isolation structure 104 can be formed by using a suitable conventional method. In the present embodiment, the isolation structure 104 is a silicon oxide shallow trench isolation structure.

Referring to FIG. 2B, then, buried word lines 110 are formed in the substrate 102. In this embodiment, the buried word line 110 includes a first conductive layer 110A and a second conductive layer 110B. More specifically, the substrate 102 may be etched to form word line trenches in the substrate 102. Then, a first conductive material is conformally formed in the word line trenches. Next, a second conductive material is formed to fill the word line trenches. Afterward, the first conductive material and the second conductive material are etched to a desired thickness by an etch-back process to form the first conductive layer 110A and the second conductive layer 110B. The first conductive material may include titanium, titanium nitride, tungsten nitride, tantalum, or tantalum nitride or a combination thereof. The second conductive material may include tungsten, aluminum, copper, gold, silver, an alloy thereof, other suitable metal materials, or a combination thereof. In the present embodiment, the first conductive layer 110A is made of titanium nitride, and the second conductive layer 110B is made of tungsten.

Then, dielectric material is filled into the word line trenches, and the excess dielectric material is removed by the planarization process to form first dielectric layers 106 in the word line trenches. Each first dielectric layer 106 is located above one of the buried word lines 110 and is in direct contact with the buried word lines 110. The material of the first dielectric layer 106 may include an oxide, a nitride, an oxynitride or a combination thereof. In the present embodiment, the first dielectric layer 106 is silicon nitride.

Referring to FIG. 1, FIG. 2A and FIG. 2B, a first insulating layer 108, a protective layer 112, a first mask layer 114 and a first photoresist layer 116 are sequentially formed to cover the substrate 102. Then, the first photoresist layer 116 is patterned to have openings which are used to define the subsequently formed bit line contact trenches 115.

Figure 3A:
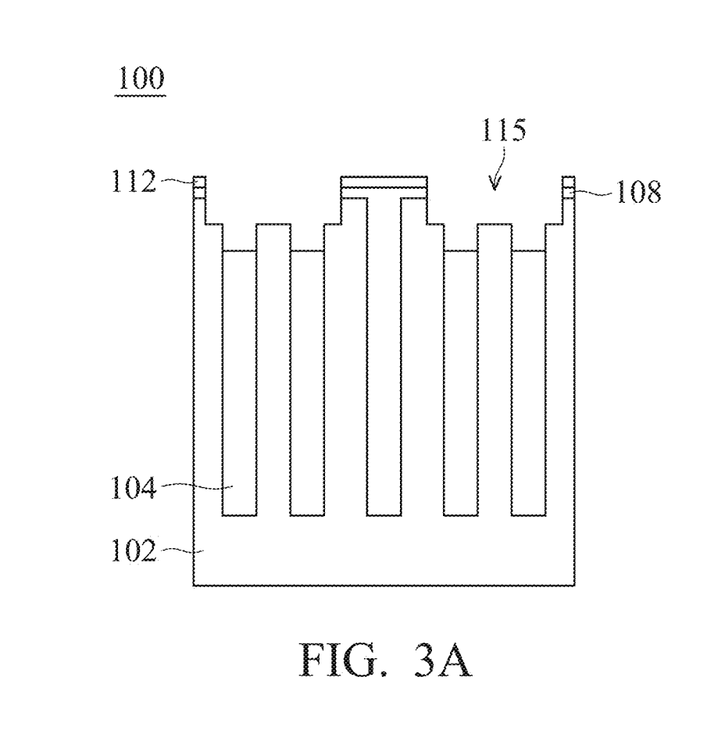
Figure 3B:
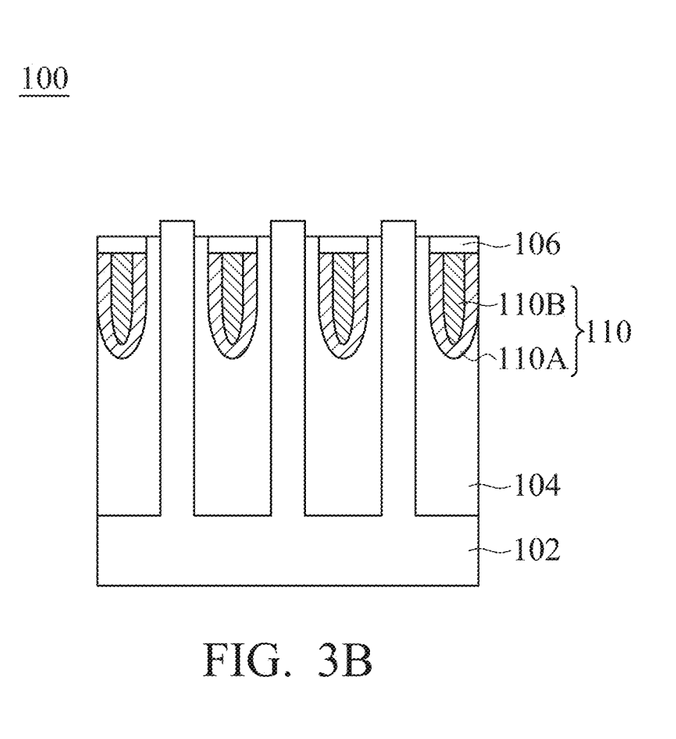

Referring to FIG. 1, FIG. 3A and FIG. 3B, the protective layer 112, the first insulating layer 108, the isolation structure 104 and the first dielectric layer 106 are partially removed by a first patterning process using the patterned first photoresist layer 116 as a mask. Therefore, the bit line contact trenches 115 are formed in the first insulating layer 108, the protective layer 112 and the substrate 102. In addition, the top surface of the first dielectric layer 106 and the top surface of the isolation structure 104 are lower than the top surface of the substrate 102. That is, the bottom surface of the bit line contact trenches 115 is lower than the top surface of the substrate 102. Moreover, the first mask layer 114, the protective layer 112, and the first insulating layer 108 in the bit line contact trenches 115 are all removed, and the substrate 102 and the first dielectric layer 106 are exposed, as shown in FIG. 3B. After the first patterning process, the first mask layer 114 is completely removed. The first patterning process may be an anisotropic dry etching process.

During the first patterning process, the protective layer 112 can prevent the first insulating layer 108 from being over-etched, thereby preventing short-circuit between adjacent bit line contacts, and improving the yield of the memory device. The materials of the first insulating layer 108 and the protective layer 112 may each independently include an oxide, a nitride, an oxynitride, a carbide, other suitable insulating materials, or a combination thereof. In order to prevent the bit line contact trench 115 from being over-etched, the material of the protective layer 112 is different from the material of the first insulating layer 108. In the present embodiment, the first insulating layer 108 is silicon nitride, and the protective layer 112 is silicon oxide. Suitable mask material and photoresist material may be used for the first mask layer 114 and the first photoresist layer 116, respectively. These materials will not be described in detail herein.

Figure 4A:
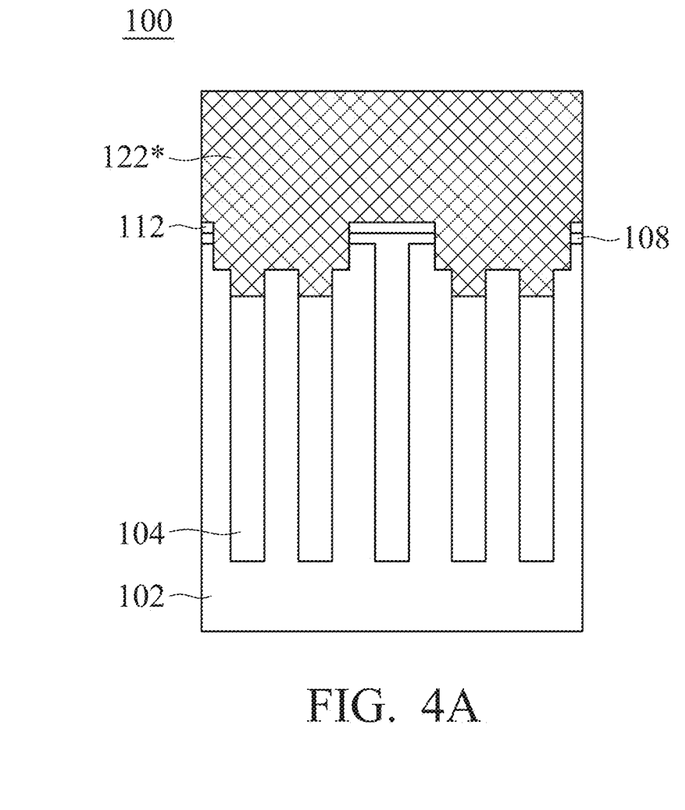
Figure 4B:
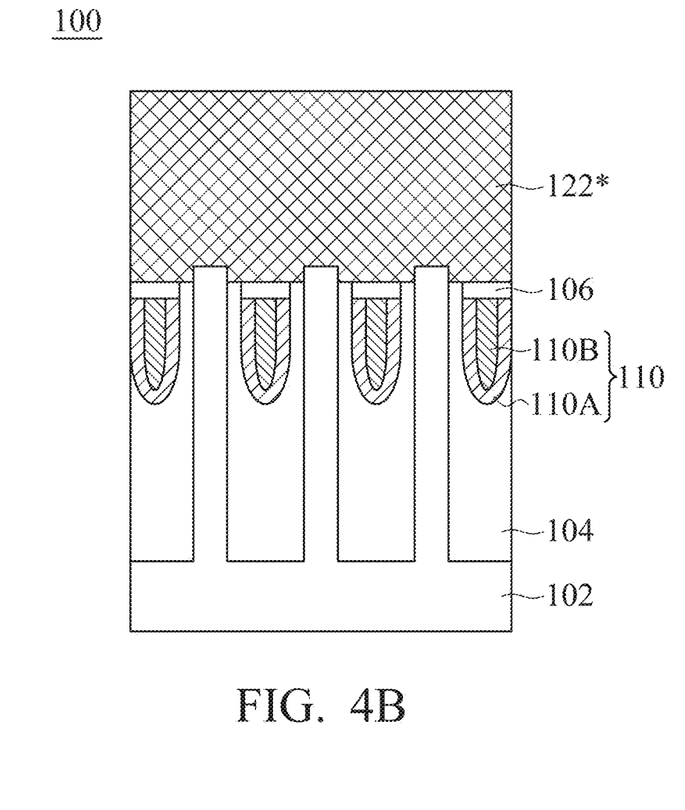
FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, and FIG. 10B are cross-sectional views corresponding to various steps of manufacturing a DRAM in accordance with some embodiments of the present invention.

Referring to FIG. 1, FIG. 4A and FIG. 4B, a first conductive material 122* is formed on the substrate 102 to fill up the bit line contact trenches 115. Then, a planarization process (for example, a chemical mechanical polishing process) may be optionally performed to reduce the thickness of the first conductive material 122* and make the first conductive material 122* have a flat top surface. The first conductive material 122* may include doped polycrystalline silicon, other suitable conductive materials, or a combination thereof. In the present embodiment, the first conductive material 122* is arsenic-doped polycrystalline silicon.

Figure 5A:
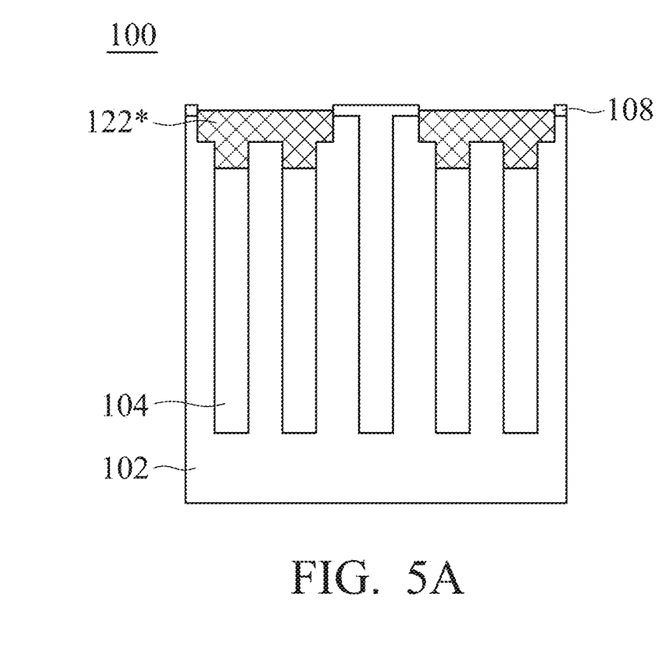
Figure 5B:
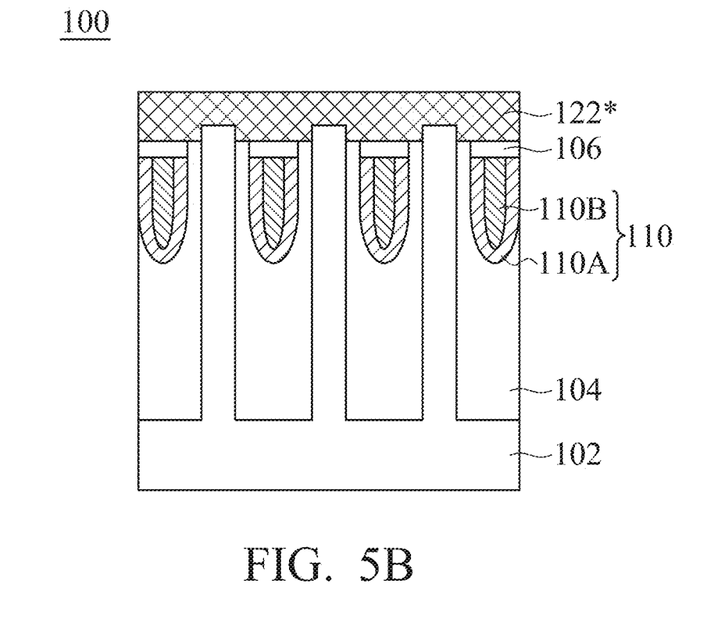

Referring to FIG. 1, FIG. 5A and FIG. 5B, an etching process is performed to remove the protective layer 112 and further reduce the thickness of the first conductive material 122*. Therefore, the first insulating layer 108 is exposed, and the top surface of the first conductive material 122* is lower than the top surface of the first insulating layer 108. In other words, by this etching process, the first conductive material 122* only exists in the bit line contact trench 115.

Figure 6A:
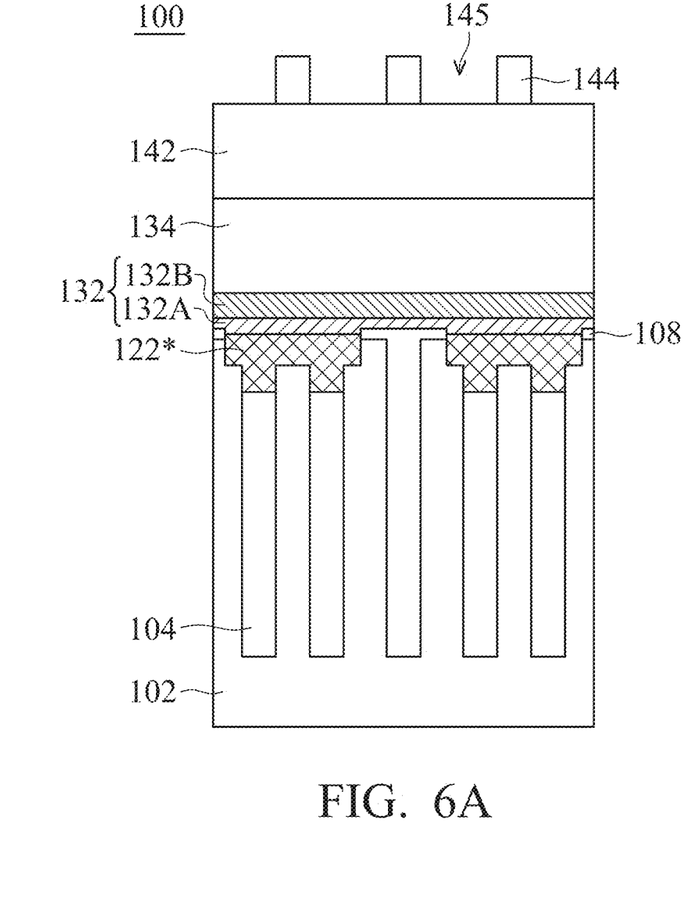
Figure 6B:
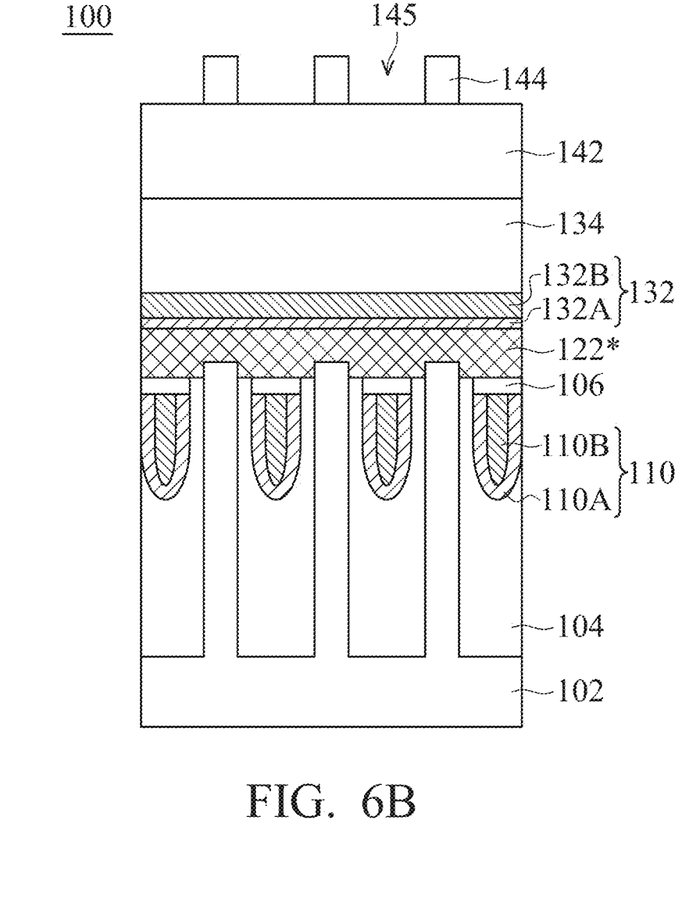

Referring to FIG. 1, FIG. 6A and FIG. 6B, a third conductive layer 132A, a fourth conductive layer 132B, a second dielectric layer 134, a second mask layer 142 and a second photoresist layer 144 are sequentially formed on the first insulating layer 108 and the first conductive material 122*. The second photoresist layer 144 has openings 145. The second dielectric layer 134 may be a single layer structure formed of a single material or a multilayer structure formed of a plurality of different materials. The material of the second dielectric layer 134 may be the same as or similar to the material of the first dielectric layer 106. In the present embodiment, the second dielectric layer 134 is a single layer structure formed of silicon nitride. In other embodiments, the second dielectric layer 134 is a three-layer structure formed of three types of silicon nitride, and these three types of silicon nitride are formed by different methods (for example, chemical vapor deposition, low pressure chemical vapor deposition, and atomic layer deposition). Suitable mask material and photoresist material may be used for the second mask layer 142 and the second photoresist layer 144, respectively. These materials will not be described in detail herein.

Figure 7A:
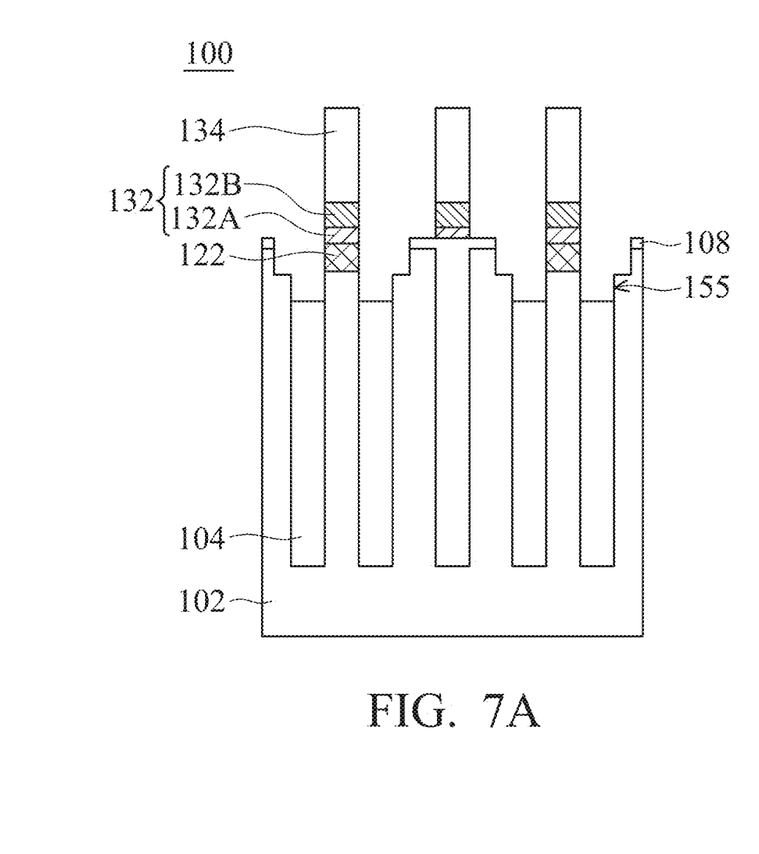
Figure 7B:
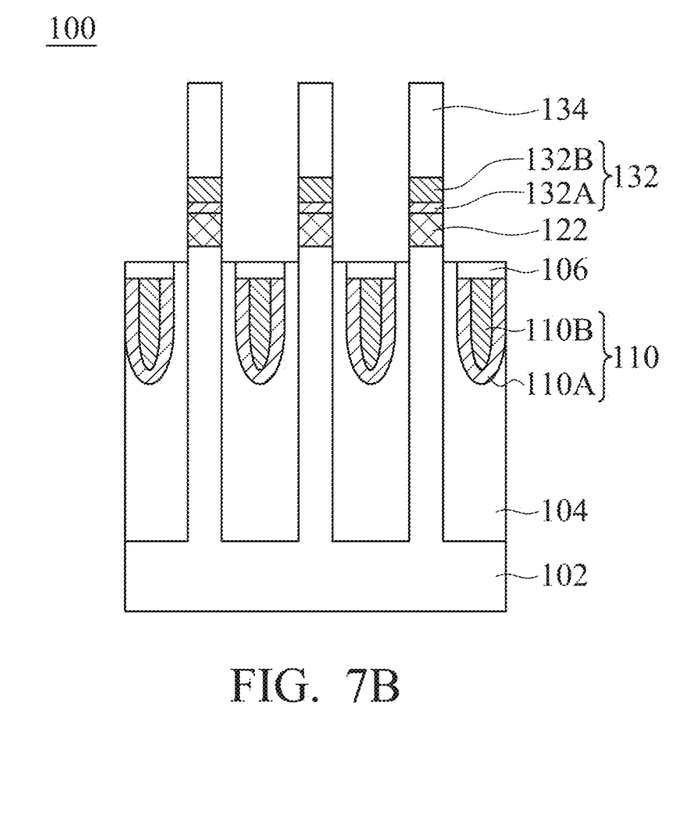

Referring to FIG. 1, FIG. 7A and FIG. 7B, a second patterning process is performed to pattern the first conductive material 122*, the third conductive layer 132A, the fourth conductive layer 132B, the second dielectric layer 134, and second mask layer 142 by using the second photoresist layer 144 as a mask. Therefore, a plurality of parallel bit lines 132 are formed, and a bit line contact structure 122 is formed between the substrate 102 and the bit line 132 at the intersection of the bit line contact trench 115 and the bit line 132, as shown in FIG. 1. More specifically, the bit line 132 includes the patterned third conductive layer 132A and the patterned fourth conductive layer 132B. Furthermore, the bit line contact structure 122 is formed by the patterned first conductive material 122*, and is located in the bit line contact trench 115.

The material of the third conductive layer 132A may be the same as or similar to the material of the first conductive layer 110A, and may be different from the first conductive material 122*. The material of the fourth conductive layer 132B may be the same as or similar to the material of the second conductive layer 110B. In the present embodiment, the third conductive layer 132A is titanium nitride, and the fourth conductive layer 132B is tungsten.

The second patterning process may be an anisotropic dry etching process. During the second patterning process, the removal rate of the first conductive material 122* is much greater than the removal rate of the first insulating layer 108 and the removal rate of the substrate 102. Therefore, it is possible to completely remove the first conductive material 122* not masked by the second photoresist layer 144 while maintaining the shapes of the first insulating layer 108 and the substrate 102.

Furthermore, in order to avoid the occurrence of short-circuit, the etching depth of the second patterning process is deeper than the bottom surface of the bit line contact structure 122. Referring to FIG. 7A, the bit line contact trench 115 has recessed portions 155 formed in the substrate 102. The recessed portion 155 has a stepped cross-sectional profile, and the bottom surface of the recessed portion 155 (i.e., the top surface of the isolation structure 104) is lower than the bottom surface of the bit line contact structure 122. Referring to FIG. 7B, the bottom surface of the bit line contact structure 122 is higher than the top surface of the first dielectric layer 106. As a result, it can be ensured that adjacent bit line contact structures 122 are completely separated from each other, so as to prevent short-circuit therebetween.

Figure 8A:
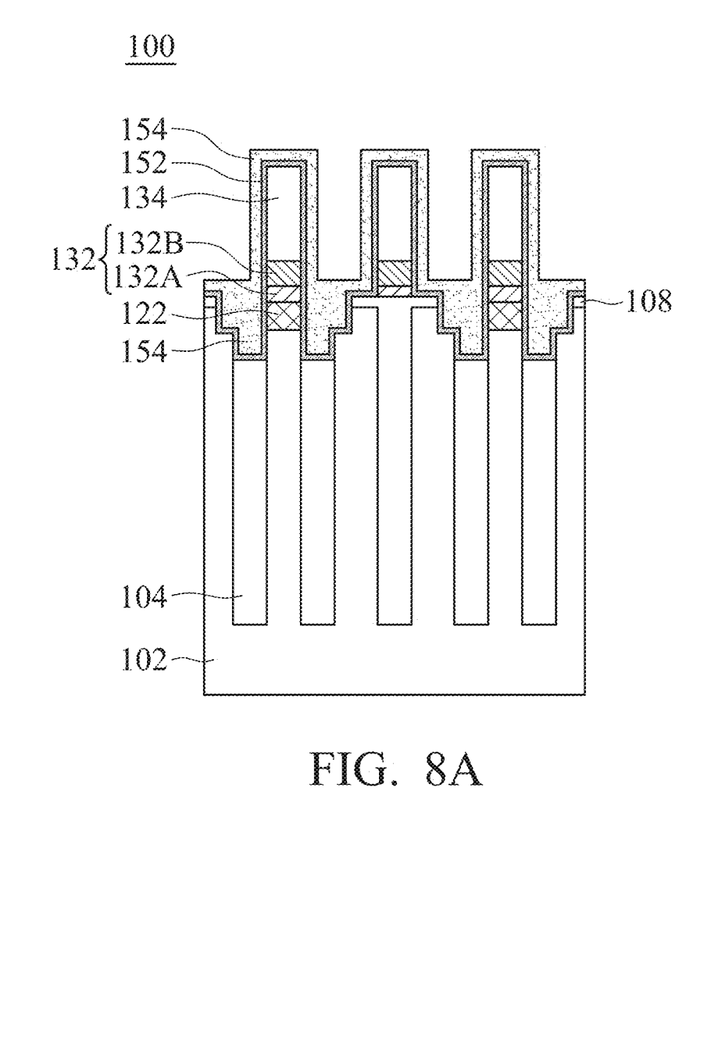
Figure 8B:
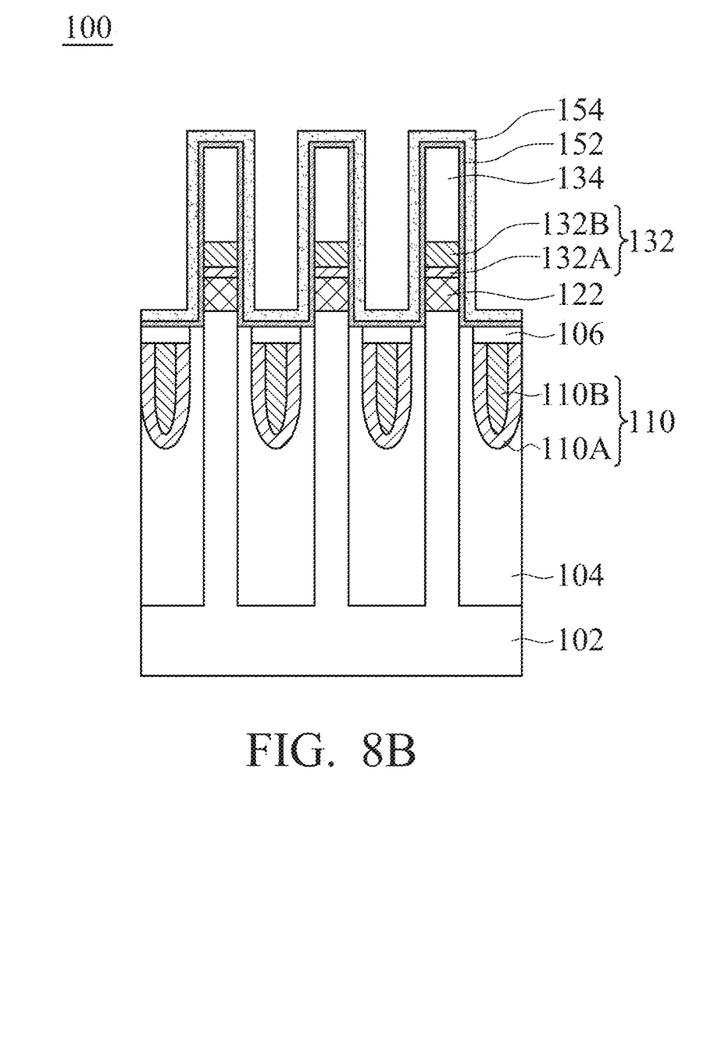

Referring to FIG. 1, FIG. 8A and FIG. 8B, an insulating liner 152 is conformally formed to cover the substrate 102, the bit line contact structure 122, the bit line 132, and the second dielectric layer 134. Then, a second insulating layer 154 is formed on the insulating liner 152 to fill up the recessed portions 155, and conformally cover the remaining portion of insulating liner 152. Referring to FIG. 8A, the second insulating layer 154 conformally covers the remaining portion of insulating liner 152 where is above the top surface of the patterned third conductive layer 132A. Referring to FIG. 8B, the second insulating layer 154 is conformally formed on the insulating liner 152. The materials of the insulating liner 152 and the second insulating layer 154 may each independently include an oxide, a nitride, an oxynitride, a carbide, other suitable insulating materials, or a combination thereof. In the present embodiment, the insulating liner 152 is silicon oxynitride, and the second insulating layer 154 is silicon nitride.

Figure 9A:
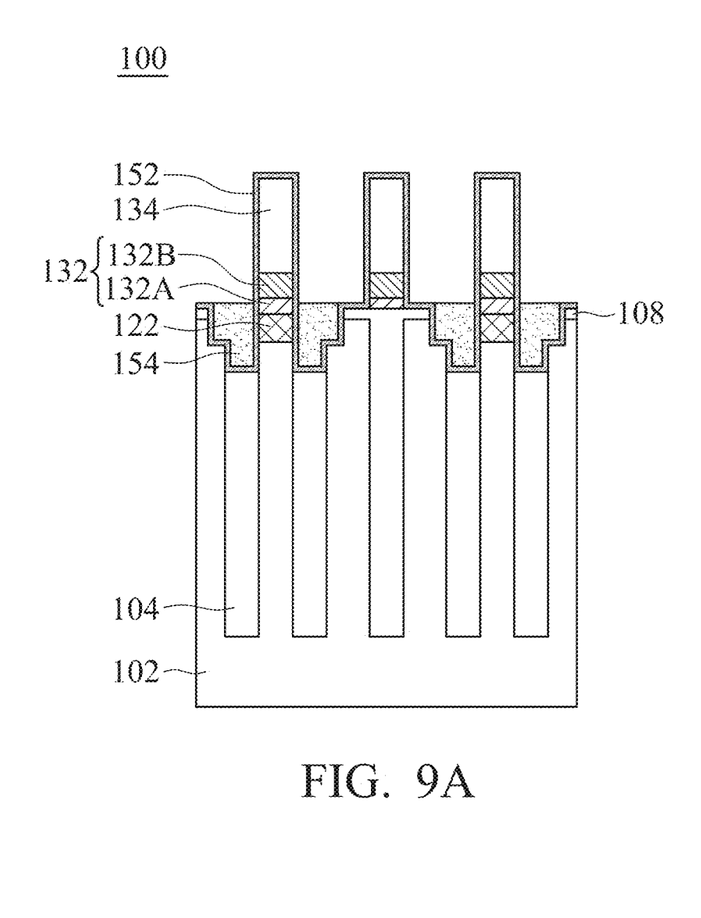
Figure 9B:
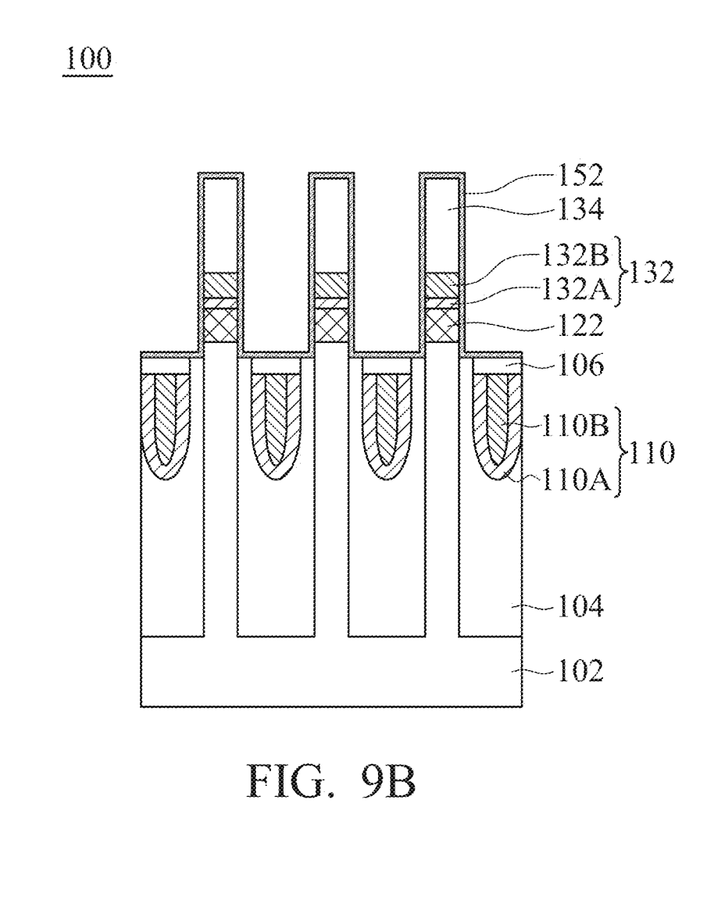

Referring to FIG. 1, FIG. 9A and FIG. 9B, an etching process is performed to partially remove the second insulating layer 154, so as to expose a portion of the insulating liner 152 where is above the recessed portions 155. During this etching process, the removal rate of the second insulating layer 154 is much greater than the removal rate of the insulating liner 152. Therefore, it is possible to remove the second insulating layer 154 outside the recessed portion 155 while maintaining the shape of the insulating liner 152. After this etching process, the remaining second insulating layer 154 still fills the recess 155 to ensure that adjacent bit line contact structures 122 are insulated from each other. In the present embodiment, the top surface of the remaining second insulating layer 154 is coplanar with the top surface of the insulating liner 152 where is located on the first insulating layer 108.

Figure 10A:
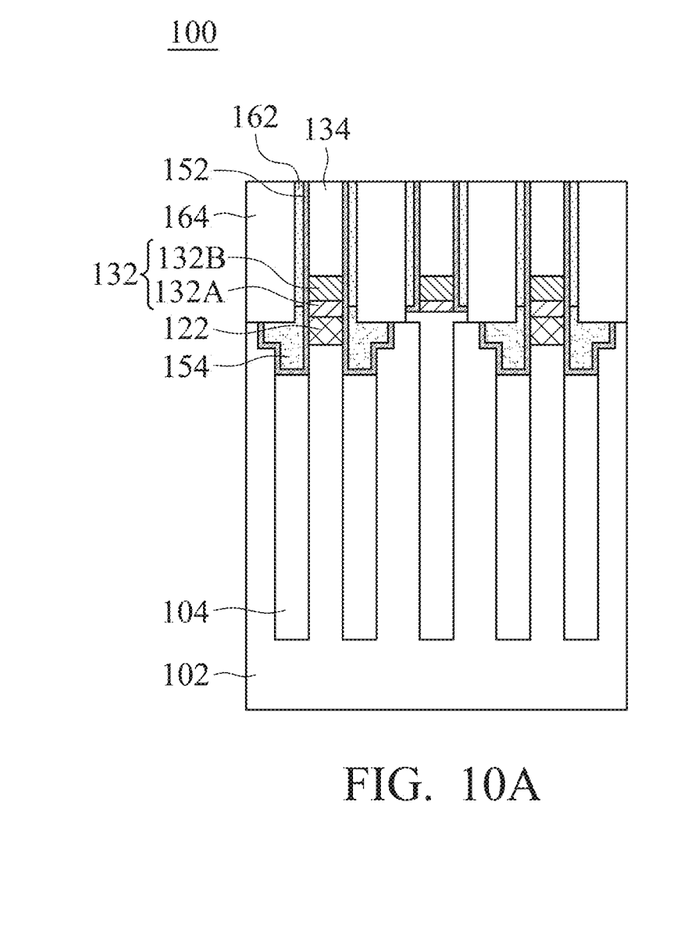
Figure 10B:
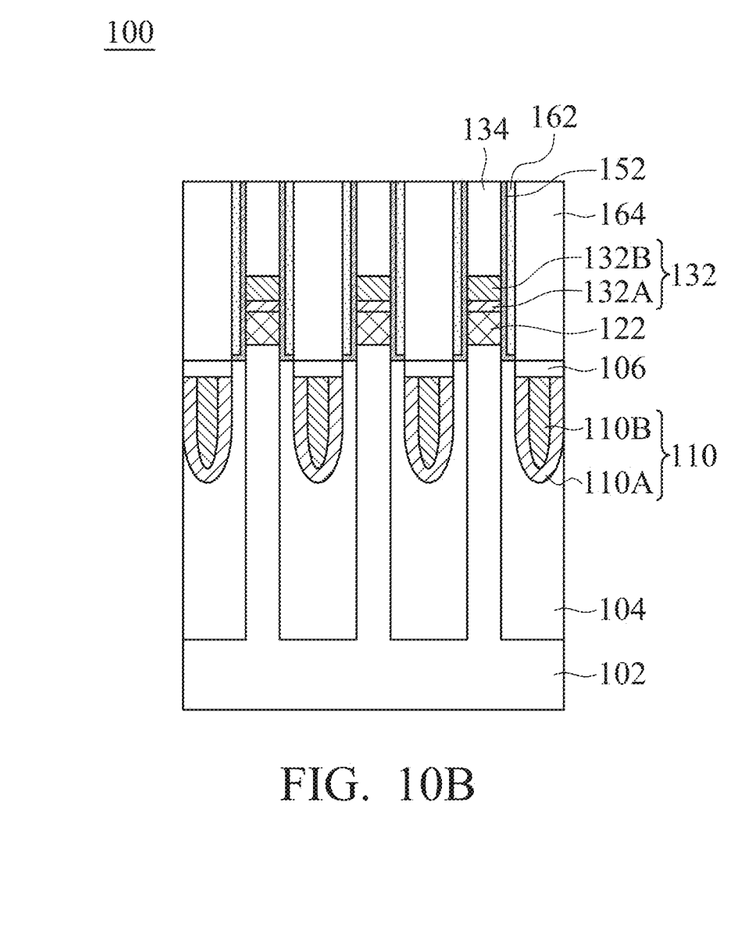

Referring to FIG. 1, FIG. 10A and FIG. 10B, a spacer material is conformally formed on the insulating liner 152 and the remaining second insulating layer 154. Then, an etch-back process is performed to remove the horizontal portion of the spacer material, such that the top surface of the second dielectric layer 134 is exposed, and sidewall spacers 162 are formed on the vertical surfaces of the insulating liner 152. In addition, by the etch-back process, the portion of the insulating liner 152 where is disposed on the first insulating layer 108, the first insulating layer 108, and the portion of the second insulating layer 154 where is not covered by the sidewall spacers 162 are removed. Therefore, the remaining second insulating layer 154 has protrusion upward to the bottom surface of the sidewall spacer 162. Next, a gap-filling layer 164 is formed to cover the substrate 102 and fill up the gaps between the sidewall spacers 162. Next, a planarization process is performed so that the top surface of the second dielectric layer 134, the top surface of the insulating liner 152, the top surface of the sidewall spacer 162, and the top surface of the gap-filling layer 164 are level with each other.

The sidewall spacer 162 may be a single layer structure formed of a single material or a multilayer structure formed of a plurality of different materials. The material of the sidewall spacer 162 may include an oxide, a nitride, an oxynitride, other suitable dielectric materials, or a combination thereof. In the present embodiment, the sidewall spacer 162 is a single layer structure formed of silicon oxide. A precursor having better fluidity may be coated on the substrate 102 by a spin coating process. Afterward, the precursor is cured by using light energy or heat energy to form the gap-filling layer 164. The material of the gap-filling layer 164 may include an oxide, other suitable dielectric materials, or a combination thereof. In the present embodiment, the gap-fill layer 164 is spin-on glass. Afterward, other conventional processes can be performed to complete the DRAM 100. These conventional processes will not be described in detail herein.

In the manufacturing method of the DRAM provided in the present embodiment, a plurality of parallel bit line contact trenches are formed first, and then a bit line contact structure is formed at the intersection of the bit line contact trench and the bit line in a self-aligned manner. Such a method can improve the yield of the memory device, and can reduce the complexity of the manufacturing process and the production cost.

More specifically, in some conventional methods, discontinuous bit line contact holes are usually formed in the substrate, and then a conductive material is filled into the bit line contact holes to form bit line contact structures. However, the size of the bit line contact hole may be very small and the bit line contact holes are densely arranged. In the lithography process for forming the bit line contact holes, short-circuit between adjacent bit line contact structures is easily occurred, or the bit line contact structure may not be formed, or the non-ideal formed bit line contact structure may cause fail of DRAM. In other words, if this conventional method is adopted, it is easy to reduce the yield of the memory device.

Furthermore, in some other conventional methods, discontinuous bit line contact holes are formed by two exposure steps. More specifically, a first exposure step is first performed to form a first trench extending in a first direction. Then, a second exposure step is performed to form the second trench extending along a second direction perpendicular to the first direction. After that, an etching process is performed to form a bit line contact hole at the intersection of the first trench and the second trench. However, this conventional method must use at least two masks to form discontinuous bit line contact holes. Therefore, compared with the manufacturing method provided by the present invention, if this conventional method is adopted, at least one mask must be added. As a result, it will increase the complexity of the manufacturing process and the production cost.

In the manufacturing method of the DRAM provided by the embodiments of the present invention, a plurality of parallel bit line contact trenches 115 are formed first, and the first conductive material 122* is filled into the bit line contact trench 115. Compared with the conventional method of forming the discontinuous bit line contact holes first, it is easier to precisely control the position and size of the bit line contact trench 115. Also, it is easier to fill the first conductive material 122* into the bit line contact trench 115. Therefore, the position and size of the bit line contact structure 122 can be precisely controlled. As a result, the above-mentioned problems of short-circuit and failure can be avoided. In other words, the manufacturing method of the DRAM provided by the embodiments of the present invention can improve the yield of the memory device.

In addition, in the manufacturing method of the DRAM provided by the embodiments of the present invention, the bit line 132 and the bit line contact structure 122 can be formed at the same time by using only one mask (i.e. the second photoresist layer 144). Therefore, compared with the above-mentioned conventional method, the manufacturing method provided by the present invention can reduce the use of a mask, thereby reducing the complexity of the manufacturing process and the production cost.

Referring to FIG. 1, FIG. 10A and FIG. 10B, in some embodiments, a DRAM 100 is provided. The DRAM 100 includes a substrate 102, isolation structures 104, buried word lines 110, first dielectric layers 106, bit line contact structures 122, and bit lines 132. The buried word lines 110 and the first dielectric layers 106 are formed in word line trenches of the substrate 102. Each of the first dielectric layers 106 is formed on one of the buried word lines 110 and has a top surface which is lower than the top surface of the substrate 102. The bit line contact structure 122 is formed on the substrate 102, and has a bottom surface which is higher than the top surfaces of the first dielectric layer 106 and the isolation structure 104. The bit lines 132 are formed on the bit line contact structures 122.

Referring to FIG. 3B, after the first patterning process, the top surface of the first dielectric layer 106 is lower than the top surface of the substrate 102. That is, the surface of substrate 102 is exposed. As a result, the subsequently formed bit line contact structure 122 can directly contact the active region 105 of the substrate 102, and the yield of the memory device can be further improved.

FIG. 1 is a perspective top-view of the DRAM 100 in accordance with some embodiments of the present invention. In order to simplify the figure, only the active region 105, the buried word lines 110, the bit line contact trenches 115, the bit lines 132, and the bit line contact structures 122 are shown in FIG. 1. In FIG. 1, the active region 105 is substantially a partial region of the substrate 102 (for example, a region doped with p-type dopants or n-type dopants). Therefore, the active regions 105 are drawn with a dotted line. In FIG. 1, the bit line contact trenches 115 do not exist in the structure of FIG. 10A or FIG. 10B, therefore, the bit line contact trenches 115 are also drawn with a dotted line. In FIG. 1, the bit line contact structure 122 is interposed between the bit line 132 and the substitute 102. Therefore, in order to easily distinguish the bit line contact structure 122, the position and shape of the bit line contact structure 122 are indicated by dotted lines.

Referring to FIG. 1, a plurality of buried word lines 110 are parallel to each other and extend along the first direction (for example, in the vertical direction in FIG. 1). A plurality of bit lines 132 are parallel to each other and extend along a second direction that is perpendicular to the first direction. A plurality of bit line contact trenches 115 are parallel to each other and extend along the third direction, which is different from the first direction and the second direction. Therefore, the bit line contact structure 122 is a parallelogram in the top-view, as shown in FIG. 1. The plurality of active regions 105 are parallel to each other and extend along the fourth direction, which is different from the first direction, the second direction, and the third direction. In order to increase the arrangement density of the bit line contact structures 122, an angle included between the third direction and the second direction is an acute angle of 10-80 degrees. In other embodiments, the included angle is an acute angle of 30-60 degrees.

In summary, in the manufacturing method of the DRAM provided by the embodiments of the present invention, the position and size of the bit line contact trench 115 can be precisely controlled, thereby preventing short-circuits and the failure of the bit line contact structures. Therefore, the manufacturing method of the DRAM provided by the embodiments of the present invention can improve the yield of the memory device. Furthermore, in the manufacturing method of the DRAM provided by the embodiments of the present invention, the bit line and the bit line contact structure can be simultaneously formed in the same patterning process. Therefore, one mask can be omitted, thereby reducing the complexity of the manufacturing process and the production cost. In addition, the manufacturing method of the DRAM provided by the embodiments of the present invention can be easily integrated into the existing manufacturing process without additional replacement or modification of production equipment.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A DRAM, comprising:
   a buried word line formed in a word line trench of a substrate, and extending along a first direction;

a first dielectric layer formed in the word line trench, located on the buried word line, and having a top surface lower than a top surface of the substrate;

a bit line contact structure formed on the substrate, and having a bottom surface higher than the top surface of the first dielectric layer; and a bit line formed on the bit line contact structure, and extending along a second direction perpendicular to the first direction.

2. The DRAM as claimed in claim 1, further comprising an insulating liner formed on sidewalls of the bit line, sidewalls of the bit line contact structure, and sidewalls of the substrate where protrudes from the top surface of the first dielectric layer, and a bottom surface of the insulating liner is lower than the top surface of the substrate.

3. The DRAM as claimed in claim 1, wherein the bit line contact structure is a parallelogram in a top-view.

4. The DRAM as claimed in claim 1, further comprising:

a recessed portion formed in the substrate and adjacent to the bit line, wherein the recessed portion has a stepped cross-sectional profile; and a second insulating layer filling the recessed portion.

5. The DRAM as claimed in claim 4, wherein a bottom surface of the recessed portion is lower than the bottom surface of the bit line contact structure.

6. A method for manufacturing a DRAM, comprising:

forming a buried word line in a word line trench of a substrate, wherein the buried word line extends along a first direction;

forming a first dielectric layer in the word line trench, wherein the first dielectric layer is located on the buried word line and has a top surface lower than a top surface of the substrate;

forming a bit line on the substrate, wherein the bit line extends along a second direction perpendicular to the first direction;

forming a bit line contact structure on the substrate, wherein the bit line contact structure is located between the bit line and the substrate, wherein a bottom surface of the bit line contact structure is higher than the top surface of the first dielectric layer.

7. The method for manufacturing the DRAM as claimed in claim 6, wherein forming the bit line contact structure comprises:

forming a first insulating layer on the substrate;

forming a protective layer on the first insulating layer;

performing a first patterning process to form a bit line contact trench in the first insulating layer and the protective layer, wherein the bit line contact trench extends a third direction different from the first direction and the second direction;

forming a first conductive material on the substrate and filling the bit line contact trench; and performing a second patterning process to partially remove the first conductive material and form the bit line contact structure at the intersection of the bit line contact trench and the bit line.

8. The method for manufacturing the DRAM as claimed in claim 7, further comprising:

forming a second conductive material on the first conductive material; and performing the second patterning process to form the bit line and the bit line contact structure simultaneously, wherein the bit line comprises the second conductive material, and the bit line contact structure comprises the first conductive material.

9. The method for manufacturing the DRAM as claimed in claim 7, wherein an angle included between the third direction and the second direction is an acute angle of 10-80 degrees.

10. The method for manufacturing the DRAM as claimed in claim 7, further comprising:

after forming the first conductive material, performing an etching process to remove a portion of the first conductive material;

wherein after performing the etching process, a top surface of the first conductive material is lower than a top surface of the first insulating layer.

11. The method for manufacturing the DRAM as claimed in claim 7, wherein the first insulating layer, the protective layer, and the first dielectric layer are partially removed in the first patterning process, and after performing the first patterning process, the top surface of the first dielectric layer is lower than the top surface of the substrate.

12. The method for manufacturing the DRAM as claimed in claim 7, further comprising:

after performing the second patterning process, forming a recessed portion in the substrate and adjacent to the bit line, wherein the recessed portion has a stepped cross-sectional profile; and forming second insulating layer to fill the recessed portion.

* * * * *